(12) United States Patent
Hammond et al.

(10) Patent No.: US 6,394,853 B1
(45) Date of Patent: May 28, 2002

(54) DATA CONNECTOR FOR SELECTIVE SWITCHING BETWEEN AT LEAST TWO DISTINCT MATING CONNECTOR PLUGS

(75) Inventors: Bernie Hammond; Terry Ward, both of Cordova; Ian Rubin De La Borbolla, Memphis, all of TN (US)

(73) Assignee: Thomas & Betts International, Inc., Sparks, NV (US)

(*) Notice: Subject to any disclaimer, the term of this patent is extended or adjusted under 35 U.S.C. 154(b) by 52 days.

(21) Appl. No.: 09/632,322

(22) Filed: Aug. 4, 2000

(51) Int. Cl.$^7$ .............................................. H01R 23/02
(52) U.S. Cl. ...................................................... 439/676
(58) Field of Search ................................. 439/188, 676, 439/941; 200/51.03, 51.05, 51.06, 51.07, 533, 536, 551

(56) References Cited

U.S. PATENT DOCUMENTS

| | | | |
|---|---|---|---|
| 3,792,405 A | 2/1974 | Hatsugia et al. ............. | 337/140 |
| 4,021,627 A | 5/1977 | Francisco .................. | 200/56 R |
| 4,156,931 A | 5/1979 | Adelman et al. ........... | 364/900 |
| 4,518,832 A | 5/1985 | Geremia ........................ | 200/4 |
| 4,903,340 A | 2/1990 | Sorensen ..................... | 455/617 |
| 5,096,442 A | 3/1992 | Arnett et al. ................ | 439/676 |
| 5,169,346 A | 12/1992 | Johnston ...................... | 439/676 |
| 5,244,402 A | 9/1993 | Pasterchick et al. ........ | 439/217 |
| 5,269,708 A | 12/1993 | DeYoung et al. ........... | 439/676 |
| 5,382,182 A | 1/1995 | Shen et al. .................. | 439/676 |
| 5,387,135 A * | 2/1995 | Shen et al. .................. | 439/676 |
| 5,415,570 A | 5/1995 | Sarkissian ................... | 439/676 |
| 5,626,497 A * | 5/1997 | Bouchan et al. ............ | 439/676 |
| 5,649,111 A | 7/1997 | Rehquate et al. ......... | 395/200.2 |
| 5,772,466 A | 6/1998 | Morin et al. ................ | 439/489 |
| 5,971,813 A | 10/1999 | Kunz et al. .................. | 439/676 |
| 6,106,335 A * | 8/2000 | Merchant et al. ........... | 439/620 |
| 6,120,330 A * | 9/2000 | Gwiazdowski .............. | 439/676 |
| 6,156,981 A * | 12/2000 | Ward et al. ................ | 200/16 D |
| 6,231,397 B1 * | 5/2001 | de la Borbolla et al. ... | 439/676 |
| 6,244,908 B1 * | 6/2001 | Hammond et al. ......... | 439/676 |

* cited by examiner

Primary Examiner—Brian Sircus
Assistant Examiner—Thanh-Tam Le
(74) Attorney, Agent, or Firm—G. Andrew Barger (57) ABSTRACT

The data connector of the present invention securably receives at least two distinct types of mating connector plugs having different contact arrangements. The data connector includes a housing having a mating connector receiving cavity partially defined by a rear wall. The data connector further includes a printed circuit board (PCB) positioned within the housing cavity wherein the PCB has a plurality of signal contacts electrically coupled thereto and extending from a top surface thereof. The signal contacts, which are used to frictionally engage mating contacts in the plugs, are desirably arranged in at least two vertically spaced rows to accommodate the distinct plug configurations. Mounted behind a back surface of the PCB, the data connector includes cable termination devices for receiving and terminating individual conductors of a multiconductor cable. The conductors are electrically connected to the signal contacts via an electrical trace on the PCB. In order to change the configuration of the signal contacts to accommodate different mating connectors, the present invention data connector includes a slidable switch device along a top surface of the PCB for selectively electrically connecting the signal contacts to the conductors of the multiconductor cable via the PCB logic. Slidable movement of the switch from its initial position to a second position on the PCB accommodates the contact arrangement of the second mating plug connector, ensuring that the signal contacts are correctly configured for the appropriate mating connector that is currently in use.

25 Claims, 5 Drawing Sheets

DATA CONNECTOR FOR SELECTIVE SWITCHING BETWEEN AT LEAST TWO DISTINCT MATING CONNECTOR PLUGS

FIELD OF THE INVENTION

The present invention relates generally to an apparatus that establishes electrical communication between a data connector and a multiconductor cable. More particularly, the present invention is directed to a high-speed data connector capable of accommodating mating connector plugs of varying configurations. Such a connector allows switching between at least two distinct cabling configurations without effecting a change in connector configuration or location.

BACKGROUND OF THE INVENTION

The integration of computers and computer-driven devices in contemporary society has elevated the role of the computer as a necessary tool for business, communication and recreation. As computers are called upon to support numerous, complementary tasks in commercial and residential environments, it has become imperative for multiple devices to communicate with one another so as to accomplish the desired tasks within a short duration. Such devices can establish electrical communication with one another via a plurality of well-established methods, such as internet or intranet connections that are established by ubiquitous standard telephone wires, Ethernet connections or operating systems that are Ethernet-compatible (i.e., token ring, fiber distributed data interface (FDDI), asynchronous transfer mode (ATM) and the like)., The efficiency of any communication system and/or network is directly dependent upon the integrity of the connector scheme employed therein. Reliability, connection integrity and durability are important considerations, since wiring life cycles typically span periods of ten to twenty years. In order to properly address performance specifications for telecommunications connecting hardware, several industry standards have been established that specify multiple performance levels of twisted pair and unshielded twisted pair (UTP) cabling components, such as those promulgated by the International Organization for Standardization (ISO) and the International Electrotechnical Commission (IEC). In order for a connector to be qualified for a given performance category, it must meet all applicable transmission requirements regardless of design or intended use. A typical means for establishing the requisite communication connections is a telecommunications jack that receives a mating connector plug from a computer.

For high-speed applications, two commonly used connection systems are Category 6 and Category 7 cabling. Transmission characteristics for Category 6 cables are specified up to 250 MHz over 100 ohm twisted pairs, making Category 6 a good choice for generic applications. Category 6 cabling delivers the highest level of transmission performance available without individually screened pairs, resulting in the emergence of cable and connecting hardware configurations that are tuned to one another to achieve optimum performance. Yet as manufacturers have configured mated modular plug-and-jack combinations to work together to cancel cross-talk, incompatible cross-talk cancellation technologies from different plug and jack makers can put an entire operating system at risk of falling below the Category 6 specifications.

Transmission characteristics for Category 7 cabling are specified up to 600 MHz over 100 ohm twisted pairs. Unlike the Category 6 plugs, the Category 7 plugs provide shielding between each pair of signal paths within the jack so as to reduce cross talk. Category 7 components support many applications over twisted pair cabling as well as those that require fibers or coaxial cables. Category 7 cabling is fully shielded with individually screened twisted pairs and an overall shield, enabling superior performance and bandwidth at a fraction of the cost of fiber. The fully shielded construction of category 7 cable results in a larger outside diameter and less flexibility than UTP, requiring greater care in the design of pathways and termination spaces to allow for more space and larger bend radii. Fully shielded solutions that incorporate Category 7 cabling are applicable in environments with significant ambient noise (i.e. broadcast stations), or where radiated emissions must be minimized. Category 7 cabling is further applicable in information intensive industries that require high-speed data exchange to obtain competitive advantages. Residential and commercial buildings can also implement category 7 cabling as a single cable type that serves all copper cabling requirements with improved performance and reduced costs. Since each individual pair is shielded, Category 7 channels eliminate crosstalk noise between pairs, allowing Category 7 components to support multiple applications over one cable. Global acceptance of this standard has been impaired, however, by connecting components that are limited in terms of performance, ease of use, adaptability and size: Category 7 cabling requires connectors to provide at least 60 dB of cross-talk isolation between all pairs at 600 MHz, a requirement that is 20 dB more severe than Category 6 cabling at 250 MHz.

A standard jack that is used with high-speed connection lines (such as those associated with Category 6 and Category 7 cabling) is an RJ45 connector. The RJ45 connector allows interconnection with an eight-contact data cable and has the advantage of transferring more data in a given duration. Category 6 plugs, for instance, have a row of eight (8) contacts on the upper portion of the jack to connect with corresponding contacts in the plug. Category 7 connector system plugs have four (4) separate pairs of contacts, each pair located in a corner of the Category 7 plug housing so that that cross-talk between contact pairs is reduced upon separation from one another. An RJ45 jack having eight (8) contacts may therefore be used to connect either a Category 6 or a Category 7 cable.

Currently, a consumer has to choose either a Category 6 connection system or Category 7 connection system. The process of changing from one system to another requires changing both the connector plug and jack, introducing extreme difficulty, expense and inconvenience when a switch between cabling types is desirable due to the demands of the cabling application. This is particularly evident if the jack is installed inside of a wall or other structure that is not readily obvious or mutable.

It is therefore desirable to provide a connector jack that can be used with either a Category 6 or Category 7 mating connector plug without modifying the connector jack itself There is a continuing need for improved outlet connectors that fulfill both Category 6 and Category 7 performance requirements in order to satisfy the increasing bandwidth requirements of communication systems and networks. Accordingly, the connector used to terminate category 6 and 7 cabling must accommodate the transfer of data signals between jacks and plugs without significant loss of efficiency.

SUMMARY OF THE INVENTION

It is an advantage of the present invention to provide a data connector that can accommodate mating connector plugs of varying configurations.

It is another advantage of the present invention to provide a data connector that selectively switches between Category 6 and Category 7 cabling without making any adjustments to the connector.

It is yet another advantage of the present invention to substantially reduce the requisite number of components required for assembly of a switchable data connector.

It is still another advantage of the present invention to provide a data connector wherein all contacts are open while the connector is switched from category 6 cabling to category 7 cabling, thereby eliminating the possibility of shorting category 6 contacts to category 7 contacts.

In the efficient attainment of these and other advantages, the present invention provides a data connector in the form of a jack that accommodates at least two distinct types of mating connectors in the form of a plug. The data connector of the present invention securably receives at least two distinct types of mating connector plugs having different contact arrangements. The data connector includes a housing having a mating connector receiving cavity partially defined by a rear wall. The data connector further includes a printed circuit board (PCB) positioned within the housing cavity wherein the PCB supports a plurality of signal contacts electrically coupled-thereto and extending from a top surface thereof. The signal contacts, which are used to frictionally engage mating contacts in the plugs, are desirably arranged in at least two vertically spaced rows to accommodate the distinct plug configurations. A plurality of cable termination devices for receiving and terminating individual conductors of a multiconductor cable are mounted to a bottom surface of the PCB. The conductors are electrically connected to the signal contacts via electrical traces defined on the PCB that create a PCB logic. In order to change the configuration of the signal contacts to accommodate different mating connector plugs, the present invention data connector further includes a jumper connector coupled to the PCB. The jumper connector acts as a receiver for a diminutive jumper board in sliding reciprocation therewith that has electrical traces provided on a surface thereof.

The jumper connector cooperates with a slidable switch device along a top surface of the PCB for selectively electrically connecting the signal contacts to the conductors of the multiconductor cable via the PCB logic. Slidable movement of the switch from an initial position to a second position on the PCB accommodates the contact arrangement of the second mating plug connector, ensuring that the signal contacts are correctly configured for the appropriate mating connector that is currently in use. The jumper connector houses contacts therewithin that engage the jumper board surface. When the switch is in its initial position, the jumper board is inserted into the jumper connector slot to a depth that allows the electrical traces on the jumper board to correspond with a first mating connector plug. When a second mating connector plug is inserted into the data connector, further vertical movement is translated to the jumper board, moving the jumper board toward the PCB. In this manner, different electrical traces on the jumper board engage the jumper connector contacts to correspond to the second plug. The signal contacts are thereby correctly configured for the appropriate data plug in use at the time.

DETAILED DESCRIPTION OF THE PREFERRED EMBODIMENTS

The present invention provides a data connector jack for a multiconductor cable that receives at least two distinct types of mating connector plugs having different contact arrangements. The data connector includes a housing having a receiving cavity for a mating connector plug wherein the cavity has a printed circuit board (PCB) positioned therewithin. The PCB has a plurality of signal contacts that frictionally engage mating contacts in at two distinctly configured mating connector plugs. The signal contacts are desirably arranged in at least two vertically spaced rows to accommodate the two distinct plug configurations. The data connector further includes cable termination assemblies for receiving and terminating individual conductors of the multiconductor cable. The conductors are electrically connected to the signal contacts via an electrical trace on the PCB. In order to change the configuration of the signal contacts to accommodate different connector plug designs, the data connector of the present invention provides a slidable switch for selectively establishing an electrical connection between the signal contacts and the conductors of the multiconductor cable via the PCB logic.

Figure 1:
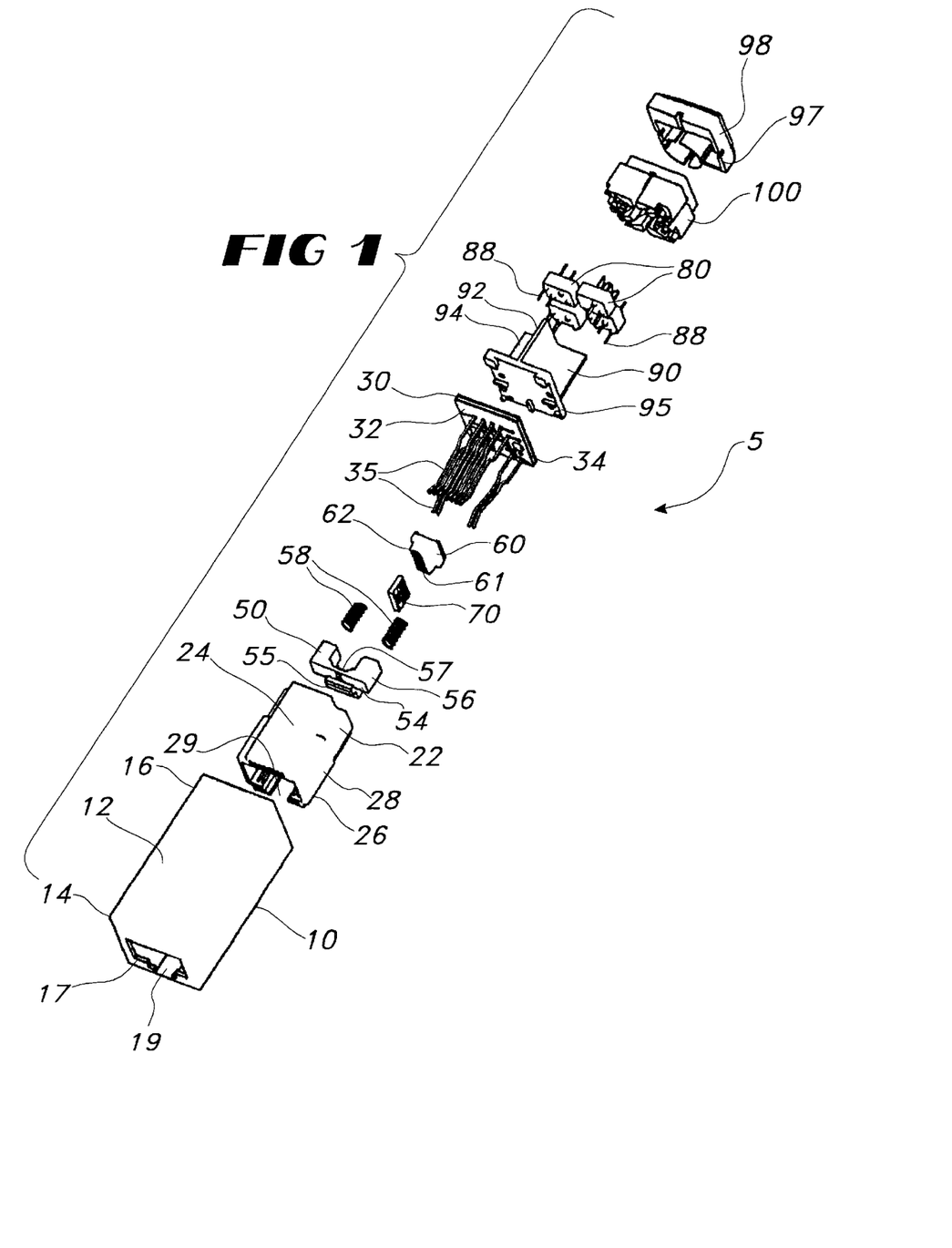
FIG. 1 is an exploded perspective view of a data connector formed in accordance with the present invention.

Now referring to the figures wherein like elements are identically numbered, a preferred embodiment of a data connector 5 of the present invention is shown in FIG. 1. Data connector 5 is desirably a jack for terminating a multiconductor cable. Data connector 5 receives at least two distinct types of mating connectors, each having a different contact configuration. The two types of mating connectors shown and referenced herein are Category 6 and Category 7 plugs, however, it is understood that data connector 5 is adaptable to accommodate a variety of mating connectors without departing from the scope of the invention.

Data connector 5 includes an external housing 10 having a peripheral wall 12 coextensive with a front extent 14 and a rear extent 16. Front extent 14 defines an aperture 17 thereat through which a mating connector enters a receiving cavity 19 within the interior of housing 10. Receiving cavity 19 is adapted to securably accept a correspondingly sized and shaped mating connector therein. Housing 10 is preferably made from a die-cast, conductive material that shields connector 5 from external electrical sources. Although housing 10 is shown as a generally rectangular structure, it is understood that any geometry conducive to the operation of this invention can be utilized.

Data connector 5 further includes an interior housing 22 insertable within receiving cavity 19. Housing 22 includes a top surface 24, a bottom surface 26 and a peripheral sidewall 28 extending therebetween having a predetermined wall thickness. Housing 22 securably fits within receiving cavity 19 and accommodates insertion of a mating connector plug in a correspondingly configured recess 29 defined therewithin. Housing 22 is preferably fabricated of an insulative plastic material that is easily molded to accommodate a variety of mating connector plug configurations.

Figure 2:
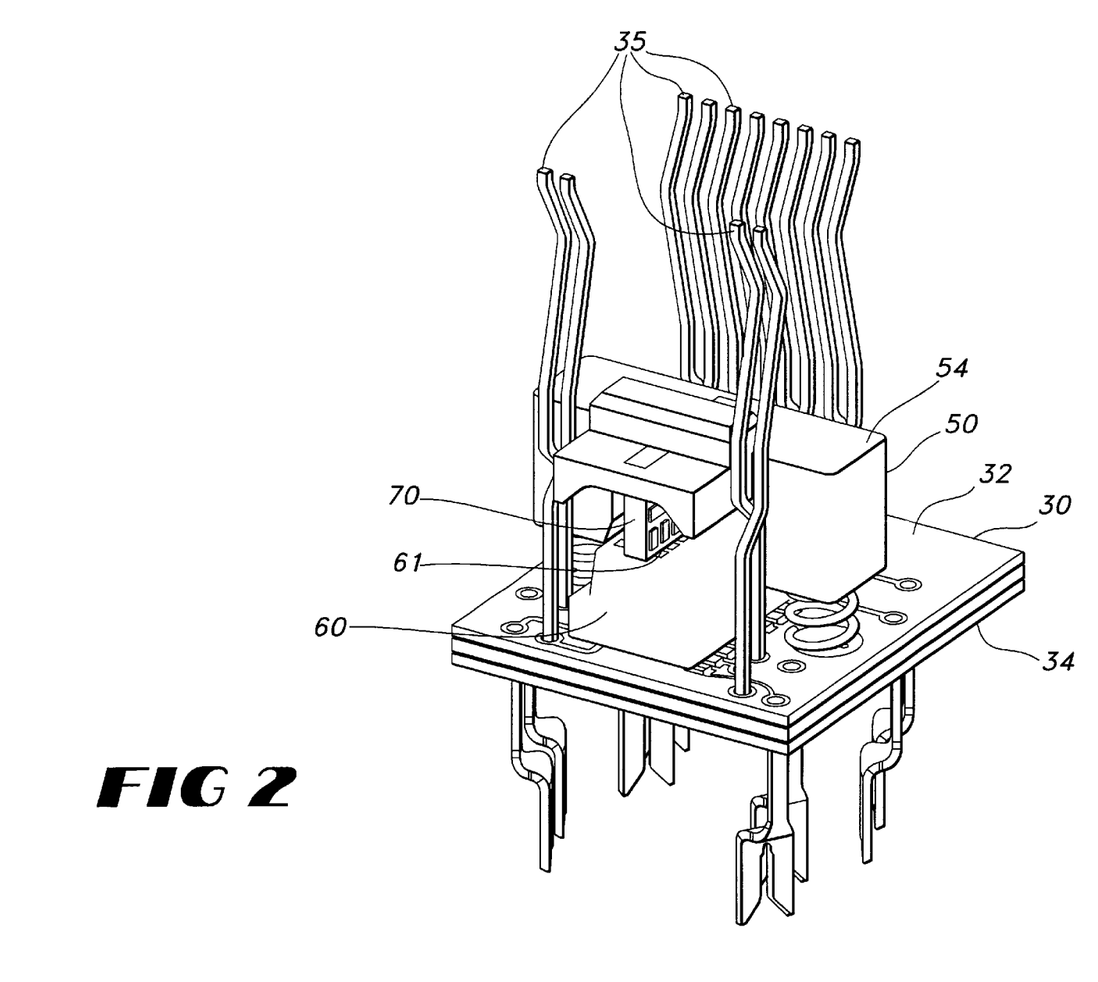
FIG. 2 is a top perspective view of a printed circuit board of the data connector of FIG. 1 supporting a slidable switch, a jumper connector with a jumper board in sliding reciprocation therewith and a plurality of contacts thereon.

Referring further to FIGS. 1 and 2, a printed circuit board (PCB) 30 is positioned within housing 10 that includes a support surface 32 from which a plurality of signal contacts 35 longitudinally depend. Contacts 35 are electrically coupled to PCB 30 and are desirably arranged adjacent to one another in vertically spaced rows as shown so that each signal contact of a mating connector plug will have a corresponding signal contact 35 in electrical communication therewith. For instance, eight signal contacts may be provided in a single row to accommodate the signal contacts on a Category 6 connector (see FIG. 2). Similarly, four additional contacts may be spaced apart from each other in pairs and parallel to the eight signal contacts to accommodate the signal contacts on a Category 7 plug (see FIG. 2). A Category 6 plug generally includes eight contacts arranged in a row while unused signal contacts in a corresponding jack are left open. A Category 7 plug desirably includes four pairs of signal contacts situated in four corners of the connector such that four unused contacts along a top row remain open when the plug is connected with the jack.

Figure 3:
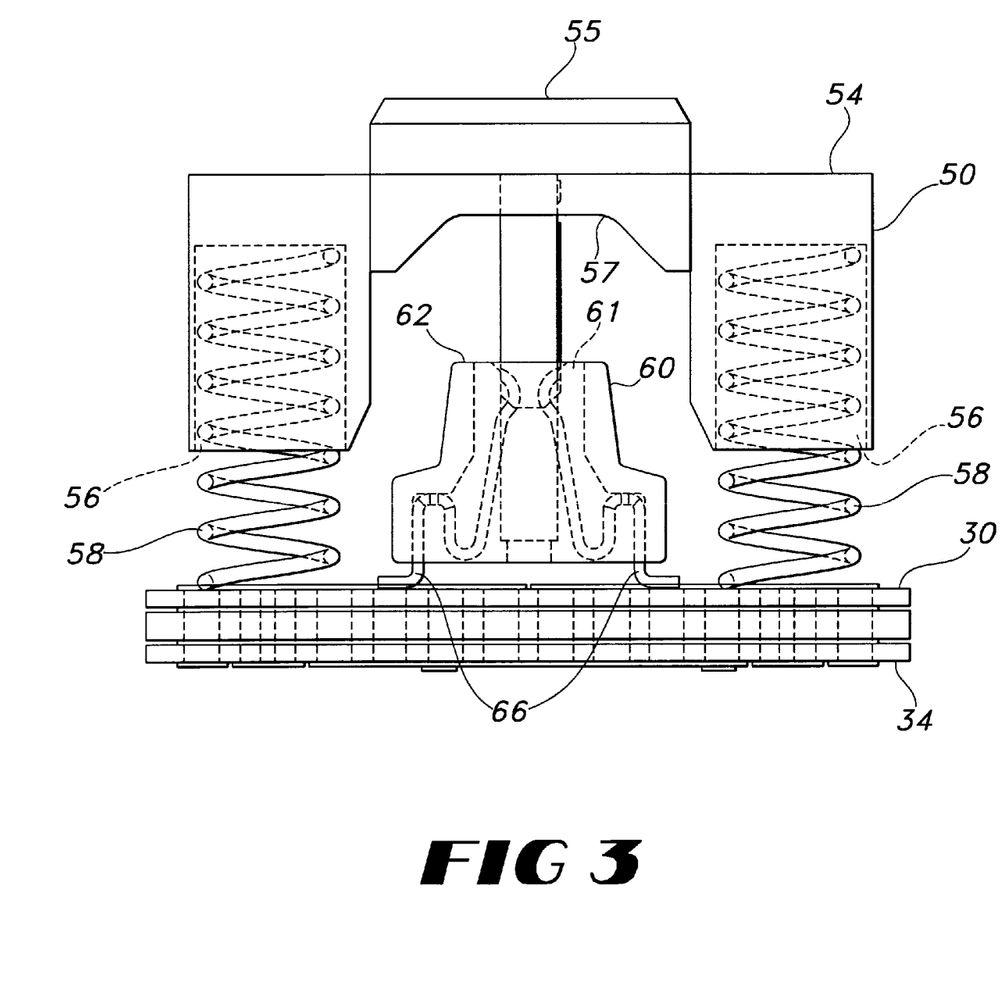
FIG. 3 is a cross-section of the printed circuit board of FIG. 2 taken through line 3—3.

Still referring to FIG. 1 and referring further to FIGS. 2 and 3, a switch 50 is slidably mounted along support surface 32. Switch 50 enables selective electrical connection of signal contacts 35 to conductors of a multiconductor cable (not shown) via the PCB logic (described further hereinbelow). Switch 50 includes each of a front switch surface 54 and a rear switch surface 56 wherein front surface 54 is positioned at a rear wall of housing cavity 19. An abutment 55 normally protrudes from front surface 54 for engagement with a mating connector plug positioned there adjacent. At least one switch spring 58 biases switch 50 away from support surface 32 and toward aperture 17. Spring 58 is desirably fabricated from a resilient material having one end contacting rear switch surface 56 and a second end contacting PCB 30.

Still referring to FIGS. 1, 2 and 3, a jumper connector 60 is positioned beneath adjacent rear switch surface 56 that includes an elongate protruding upper surface 62 and a lower surface 64. Upper surface 62 slidably engages a correspondingly configured indented surface 57 of rear switch surface 56. A slot 61 is further defined within jumper connector 60 that exposes a plurality of jumper connector contacts 66 housed therewithin. Slot 61 accommodates sliding reciprocation of a diminutive jumper board 70 therein.

Figure 4:
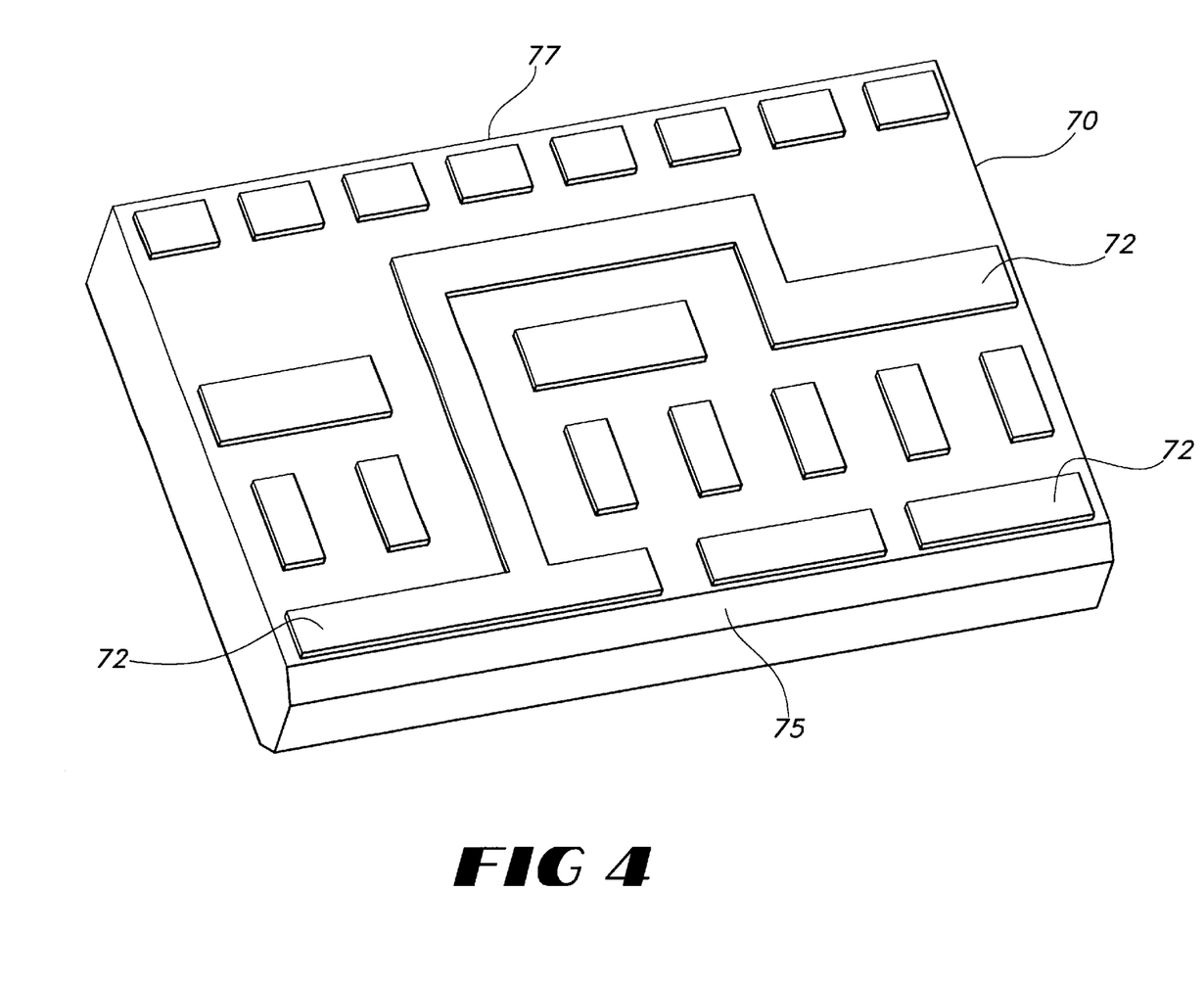
FIG. 4 is a top perspective view of the jumper board of FIGS. 2 and 3.

As further illustrated in FIG. 4, jumper board 70 desirably includes a plurality of electrical traces 72 thereon that establish mechanical and electrical communication with contacts 66 depending on the relative position therebetween. For example, while electrical traces defined along a bottom periphery 75 of jumper board 70 may correspond to a Category 6 connector plug, traces defined along an upper periphery 77 of jumper board 70 may correspond to a Category 7 plug.

Upper surface 62 has a mating protruding surface (as particularly seen in FIG. 3) such that upon application of force upon front surface 54 in a direction towards PCB 30, jumper board 70 is correspondingly translated within slot 61 along contacts 66. Contacts 66 are positioned within slot 61 and simultaneously slidably coupled with exposed electrical traces 36 defined on PCB 30 (shown in FIG. 3 and described hereinbelow) and traces 72 on jumper board 70. Contacts 66 provide a jumper means to electrically connect designated signal contacts to terminated conductors of a multiconductor cable via the PCB logic.

Figure 5:
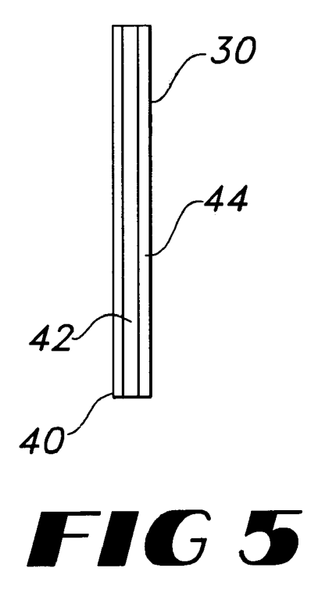
FIG. 5 is a side view of the printed circuit board of FIG. 2.
Figure 5A:
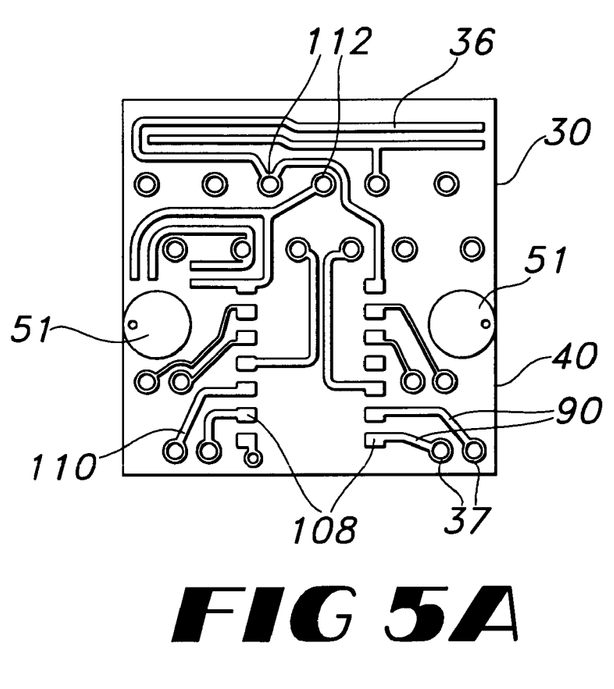
FIG. 5A is a top plan view of a top layer of the printed circuit board of FIGS. 2 and 3.

As further illustrated in FIGS. 2, 5 and 5A, PCB 30 desirably includes multiple layers of non-conductive material, for instance, a top layer 40, a middle layer 42 and a bottom layer 44. Layers 40, 42 and 44 have multiple electrical traces or imprints 36 provided thereon to create a circuit board logic (hereinafter referred to as "PCB logic.). Electrical traces 36 are configured to connect contacts 35 with at least two distinct types of mating connector plugs and to further ground any unused contacts so as to prevent shorting caused by inadvertent contact therewith. The advantage of using multiple layers is that the PCB logic, which may be very large and complex, can be compressed into a smaller form to fit inside housing 10, providing an efficient and compact circuit board thereby.

FIG. 5A particularly illustrates top layer 40 of PCB 30 having a plurality of apertures 37 therethrough. Apertures 37 are desirably plated with an electrically conductive material and connected to a plurality of contact pads 108 by a corresponding plurality of electrical imprints 110. Contact pads 108 are desirably fabricated from an electrically conductive material so that exposed surfaces thereof selectively electrically engage contact members 66 on carriage 60. PCB 30 also includes a plurality of signal contact holes 112 that are desirably plated with an electrically conductive material. Signal contacts 35 are connected to PCB 30 via insertion of the signal contacts therethrough and soldering the signal contacts in place.

PCB 30 forms a ground plane upon which a switch spring area 51 is defined. Area 51 electrically contacts switch springs 58 and grounds them to middle layer 42. As is known in the art, increased capacitance creates undesirable interference that may degrade the electrical signal in the signal contacts. This configuration thereby reduces the amount of capacitance that may be created by switch springs 58 when they are in close proximity to signal contacts 35.

PCB 30 further includes a bottom surface 34 from which a plurality of cable termination devices 80 securably depends. Termination devices 80 may include one or more conventional cable termination devices such as insulation displacement contacts (IDC) 85 or the like as illustrated in FIG. 2. Termination devices 80 receive and terminate individual conductors of a multiconductor cable. Devices 80 are secured to PCB 30 via one or more contact pins 88 to electrical traces 36 thereon.

Referring back to FIG. 1, a shield assembly 90 is positioned between bottom surface 34 of PCB 30 and cable termination devices 80. Shield assembly 90 includes a cross member 92 that extends between respective pairs of termination devices 80 to provide cross-talk shielding therebetween. Cross member 92 is defined by a vertical shield extent 94 and a horizontal shield extent 96 that together extend outward from a substantially planar surface 95 adjacent surface 34. Cross member 92 extends through gaps among termination devices 80 to a cable entry opening 97 defined within an end cap 98. Entry opening 97 is adapted to receive at least one multiconductor cable therein. In this configuration, assembly 90 contacts end cap 98 to achieve complete shielding of signal contacts 35. The use of the shield assembly 90 thereby reduces cross talk among termination assemblies 80 by shielding paired discrete conductors from one another. It is desirable that shield assembly 90 is fabricated from an electrically conductive material to further reduce cross talk among signal contacts 35.

A dressing block is provided for receiving discrete conductors of a multiconductor cable. Dressing block 100, which aligns and holds the conductors for IDCs 85 with termination devices 80, cooperates with an end cap 98 to form a terminating extent for data connector 5. The outer sheath and metallic shielding of the multiconductor cable are securely maintained between end cap 98 and dressing block 100. End cap 98 provides strain relief for the multiconductor cable and grounding for the cable shield. End cap 98 is desirably fabricated from a conductive material so as to maintain the continuity of the shielding of the multiconductor cable from the cable to data connector 5. The strain relief for the cable and the continuity of the cable shielding is maintained by the assembly of dressing block 100 with end cap 98 connected to external housing 10.

In operation, data connector 5, and particularly jumper board 70, is in an initial setting that is configured to insertably accept a first mating connector plug (i.e., a Category 6 plug) therein. Adjacent signal contacts 35 frictionally engage the plug therebetween such that the plug contacts abutment 55 without depressing springs 58 toward PCB 30. Jumper connector 60 is simultaneously positioned on electrical trace 3.6 so that contacts 66 are placed thereon, thereby configuring corresponding signal contacts 35 with the plug. Insertion of the Category 6 plug into receiving cavity 19 does not impart sliding translation to jumper board 70, for when jumper board 70 moves relative to contacts 66, contacts 66 electrically engage different portions of electrical trace 72 and thereby change the configuration of signal contacts 35 to cable termination devices 80. Correct configuration of signal contacts 35 relative to the mating connector plug received in data connector 5 is therefore assured.

A second jumper board position is realized when a second mating connector plug (i.e., a Category 7 plug) receiving a multiconductor cable therein is inserted in data connector 5. When the plug is inserted into receiving cavity 19 between adjacent signal contacts 35, it engages abutment 55, thereby depressing switch springs 58 toward top surface 32 of PCB 30. Vertical downward movement of the plug simultaneously effects engagement of indented surface 57 with correspondingly configured upper surface 62 of jumper connector 60. Jumper board 70 thereby slidably moves toward PCB 30 from the initial position to the second position relative to contacts 66. Contacts 66 maintain mechanical and electrical communication with electrical traces 72 (not shown) as jumper board 70 slides thereadjacent, :depressing jumper board 70 within slot 61.

When lower portions of jumper board 70 engage contacts 66, the jumper board, via electrical traces 72, allows signal contacts 35 to be connected and configured to accept a Category 6 data plug. When a Category 7 plug is inserted, jumper board 70 is pushed farther into slot 61 so that contacts 66 no longer touch lower traces on the surface of jumper board 70 but now engage upper traces defined thereon. Jumper board 70 is now configured for a Category 7 plug and simultaneously grounds the unused Category 6 signal contacts. Therefore, when switch 50 is pushed toward PCB 30, jumper board 70 is pushed farther into slot 61. Contacts 66 touch the upper half of jumper board 70 and reconfigure PCB 30 for a Category 7 plug.

Jumper board 70, via vertical reciprocating motion relative to jumper connector 60, reconfigures signal contacts 35 so as to leave those signal contacts associated with a first mating connector plug as open circuits and simultaneously connect those signal contacts associated with a second, distinct mating connector plug accordingly to reconfigure data connector 5 for the second plug. In each of the first and second positions, unused contacts are "left open" by the PCB logic, thereby preventing the undesirable shorting of electrical connections and associated problems with data transfer. Data connector 5 therefore automatically changes the configuration of contacts 35 based upon the configuration of a mating connector plug inserted therein. In this manner, a user does not have to take any other actions to reconfigure the data connector other than inserting the appropriate plug.

Various changes to the foregoing described and shown methods and corresponding structures would now be evident to those skilled in the art. The matter set forth in the foregoing description and accompanying drawings is therefore offered by way of illustration only and not as a limitation. Accordingly, the particularly disclosed scope of the invention is set forth in the following claims.

What is claimed is:

1. A data connector for establishing electrical communication with a multiconductor cable wherein said data connector receives at least first and second distinct types of mating connector plugs therein, said data connector comprising:

an external housing having a peripheral wall coextensive with a front extent and a rear extent, wherein said front extent defines an aperture thereat through which a mating connector enters a receiving cavity defined within said external housing, said receiving cavity being adapted to securably accept a correspondingly sized and shaped mating connector therein;

an interior housing insertable within said receiving cavity, said interior housing having a top surface, a bottom surface and a peripheral sidewall extending therebetween having a predetermined wall thickness, wherein said interior housing securably fits within said receiving cavity and accommodates insertion of said mating connector plug in a correspondingly configured recess defined therewithin;

a printed circuit board positioned within said external housing that includes a support surface from which a plurality of signal contacts longitudinally depend, wherein said signal contacts are electrically coupled to said printed circuit board;

a switch slidably mounted along said support surface having a front switch surface and a rear switch surface wherein said front switch surface is positioned at a rear wall of said receiving cavity and wherein said switch enables selective electrical connection of said signal contacts to conductors of a multiconductor cable;

a jumper connector positioned adjacent said rear switch surface having an elongate protruding upper surface and a lower surface and further having a slot defined along a vertical extent thereof wherein said slot exposes a plurality of jumper connector contacts housed therewithin; and a jumper board in sliding reciprocation with said slot, said jumper board having a plurality of electrical traces thereon that establish mechanical and electrical communication with said jumper connector contacts depending on a relative position therebetween;

such that upon application of force upon said front switch surface in a direction toward said support surface of said printed circuit board, said jumper board is correspondingly translated within said slot.

2. The data connector of claim 1 wherein said printed circuit board includes multiple layers of non-conductive material for compression of a large and complex printed circuit board logic inside said external housing.

3. The data connector of claim 2 wherein said layers include a top layer, a middle layer and a bottom layer.

4. The data connector of claim 3 wherein said layers have multiple exposed electrical traces provided thereon to create said printed circuit board logic and connect said signal contacts with at least two distinct types of mating connector plugs.

5. The data connector of claim 4 wherein said jumper connector contacts are simultaneously coupled with said electrical traces of said printed circuit board and said electrical traces on said jumper board.

6. The data connector of claim 2 wherein said printed circuit board includes a plurality of signal contact holes through which said signal contacts are connected to said printed circuit board.

7. The data connector of claim 6 wherein said signal contact holes are plated with an electrically conductive material.

8. The data connector of claim 1 wherein said rear switch surface is an indented surface.

9. The data connector of claim 8 wherein said jumper connector upper surface slidably engages said indented surface.

10. The data connector of claim 9 wherein said jumper connector upper surface has a mating protruding surface such that upon application of force upon front surface in a direction towards said printed circuit board, said jumper board is correspondingly translated within said slot along said jumper connector contacts.

11. The data connector of claim 1 further including an abutment normally protruding from said front switch surface for engagement with said mating connector plug positioned thereadjacent.

12. The data connector of claim 1 further including at least one switch spring having one end contacting said rear switch surface and a second end contacting said printed circuit board to bias said switch away from said support surface and toward said aperture.

13. The data connector of claim 1 wherein said signal contacts are arranged adjacent to one another in vertically spaced rows so that each contact of said mating connector plug will have a corresponding signal contact in electrical communication therewith.

14. The data connector of claim 13 wherein eight signal contacts are provided in a single row to accommodate contacts on a mating Category 6 connector plug.

15. The data connector of claim 14 wherein four additional contacts are spaced apart from one another in pairs and parallel to said eight signal contacts to accommodate contacts on a mating Category 7 connector plug.

16. The data connector of claim 1 wherein said external housing is fabricated from a die-cast, conductive material that shields said data connector from external electrical sources.

17. The data connector of claim 1 wherein said interior housing is fabricated from an insulative plastic material that is easily molded to accommodate a variety of mating connector plug configurations.

18. The data connector of claim 1 wherein said printed circuit board includes a bottom surface from which a plurality of cable termination devices securably depends for receiving and terminating individual conductors of said multiconductor cable.

19. The data connector of claim 18 wherein said termination devices include one or more insulation displacement contacts.

20. The data connector of claim 18 wherein said termination devices are secured to said printed circuit board by at least one contact pin depending longitudinally therefrom.

21. The data connector of claim 18 wherein a shield assembly is positioned between said bottom surface and said termination devices.

22. The data connector of claim 21 wherein said shield assembly includes a cross member that extends between respective pairs of said termination devices to provide cross-talk shielding therebetween and is defined by a vertical shield extent and a horizontal shield extent that together extend outward from a substantially planar surface adjacent said bottom surface.

23. The data connector of claim 21 wherein said shield assembly is fabricated from an electrically conductive material to further reduce cross talk among said signal contacts.

24. The data connector of claim 18 further including a dressing block for receiving discrete conductors of said multiconductor cable.

25. The data connector of claim 24 wherein said dressing block cooperates with an end cap to form a terminating extent for said data connector.

\* \* \* \* \*